(12) United States Patent
Kelly et al.

(10) Patent No.: US 7,394,667 B2
(45) Date of Patent: Jul. 1, 2008

(54) HIGH DENSITY POWER DISTRIBUTION UNIT

(75) Inventors: John H. Kelly, Phoenix, AZ (US);
Naufel C. Naufel, Tempe, AZ (US);
Irena Borucki, Mount Prospect, IL (US); Eugene R. Pilat, Barrington, IL (US); Markus Tegethoff, Algonquin, IL (US)

(73) Assignee: Emerson Network Power - Embedded Computing, Inc., Madison, WI (US)

( * ) Notice: Subject to any disclaimer, the term of this patent is extended or adjusted under 35 U.S.C. 154(b) by 148 days.

(21) Appl. No.: 11/093,628

(22) Filed: Mar. 30, 2005

(65) Prior Publication Data
US 2006/0227474 A1 Oct. 12, 2006

(51) Int. Cl.
*H01R 9/00* (2006.01)

(52) U.S. Cl. .................... 361/823; 361/686; 361/796

(58) Field of Classification Search ......... 361/796–802, 361/680–686, 822–830
See application file for complete search history.

(56) References Cited

U.S. PATENT DOCUMENTS 5,675,194 A * 10/1997 Domigan .................... 307/147
6,069,797 A * 5/2000 Widmayer et al. .......... 361/760
6,552,286 B2 * 4/2003 Yang et al. .................. 200/330
6,746,279 B1 * 6/2004 Lopez .................... 439/620.01
6,937,461 B1 * 8/2005 Donahue, IV ............... 361/622

OTHER PUBLICATIONS

"RADSOK High Amperage Electrical Terminals", Technical Brief, Revised May 2001, KonneKtech, Fraser, MI 48026, pp. 1-23.

* cited by examiner

*Primary Examiner*—Tuan T. Dinh
(74) *Attorney, Agent, or Firm*—Harness Dickey & Pierce P.L.C.

(57) ABSTRACT

A power distribution unit (306) may include a power distribution unit frame (310), where the power distribution unit frame has a 2U form factor (312), and where the power distribution unit frame is coupled to mount in an embedded computer frame (102). A plurality of power ingress sites (330) may be coupled to a rear portion (320) of the power distribution unit frame, where each of the plurality of power ingress sites has a current capacity of at least 100 amperes, where each of the plurality of power ingress sites includes an ingress pin (332) coupled to interface with an ingress in-line, hyperboloid radial socket (334), and where the power distribution unit has a current-capacity density of the plurality of power ingress sites of at least 600 amperes per power distribution unit.

11 Claims, 3 Drawing Sheets

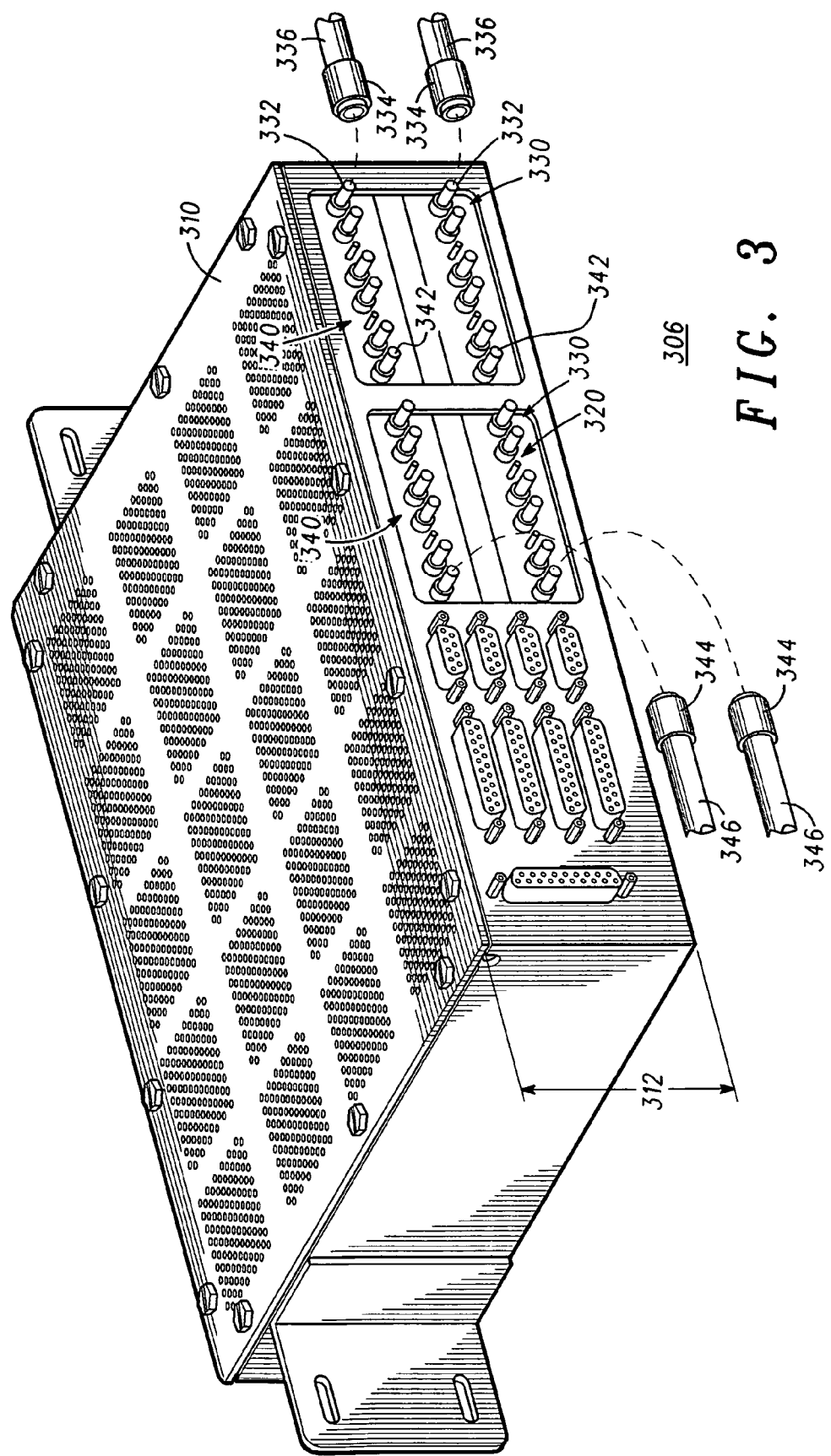

HIGH DENSITY POWER DISTRIBUTION UNIT

RELATED APPLICATIONS

Related subject matter is disclosed in U.S. patent application entitled METHOD OF MONITORING A POWER DISTRIBUTION UNIT" having application Ser. No. 11/093,855 and filed Mar. 30, 2005.

BACKGROUND OF INVENTION

Prior art power distribution units for rack-mounted embedded computer systems are limited, due to spatial constraints, in the power they can supply to individual computing blades. For example, the number of circuit breakers and power connections to a prior art power distribution unit is limited by the projected area of the front or rear portions. Further, the limited space in the rear of the power distribution unit prevents the use of larger connectors required of higher-powered inputs and outputs.

There is a need, not met in the prior art, for a high power density power distribution unit. Accordingly, there is a significant need for an apparatus and method that overcomes the deficiencies of the prior art outlined above.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

FIG. 3 representatively illustrates a power distribution unit in accordance with an exemplary embodiment of the present invention.

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the Claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventor's conception of the best mode, and are not intended to limit the applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a dynamically configurable, high power density power distribution unit, is provided as a specific enabling disclosure that may be generalized to any application of the disclosed system, in accordance with various embodiments of the present invention.

Figure 1:
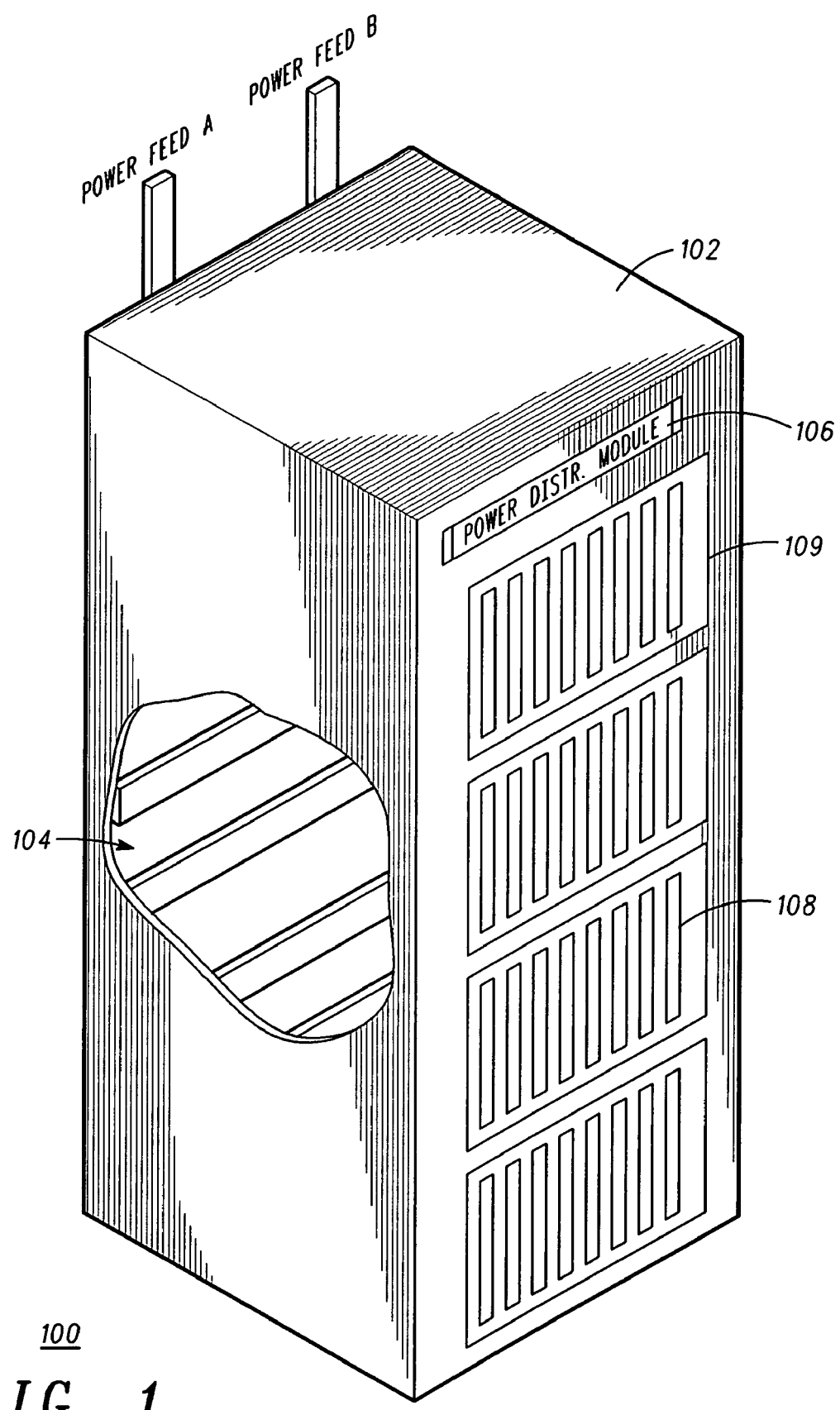
FIG. 1 representatively illustrates embedded computer system in accordance with an exemplary embodiment of the present invention.

FIG. 1 representatively illustrates embedded computer system 100 in accordance with an exemplary embodiment of the present invention. As shown in FIG. 1, embedded computer system 100 may include an embedded computer frame 102, backplane 104, shelf 109 with software and a plurality of slots for inserting computing blade 108, power distribution units 106, and the like. Backplane 104 may be used for coupling blades placed in plurality of slots and power distribution.

In an embodiment, a computing blade 108 may comprise a switch blade, payload blade, and the like, coupled to any number of other computing blades via backplane 104. Backplane 104 may accommodate any combination of a packet switched backplane including a distributed switched fabric or a multi-drop bus type backplane. Backplanes may support AdvancedTCA™, CompactPCI®, CompactTCA™, and the like. Computing blade 108 may add functionality to embedded computer system 100 through the addition of processors, memory, storage devices, I/O elements, and the like. In other words, a computing blade 108 may include any combination of processors, memory, storage devices, I/O elements, and the like, to give embedded computer system 100 any functionality desired by a user. In the embodiment shown, there are sixteen slots to accommodate any combination of power distribution units 106 and computing blades 108. However, an embedded computer frame 102 with any number of shelves 109 or slots may be included in the scope of the invention.

In an embodiment, embedded computer system 100 can use a switch blade as a central switching hub with any number of payload blades coupled to the switch blade. Embedded computer system 100 may support a point-to-point, switched input/output (I/O) fabric. Embedded computer system 100 may include both node-to-node (for example computer systems that support I/O node add-in slots) and chassis-to-chassis environments (for example interconnecting computers, external storage systems, external Local Area Network (LAN) and Wide Area Network (WAN) access devices in a data-center environment). Embedded computer system 100 may be implemented by using one or more of a plurality of switched fabric network standards, for example and without limitation, InfiniBand™, Serial RapidIO™, Ethernet™, AdvancedTCA™, CompactPCI®, CompactTCA™, PCI Express™, and the like. Embedded computer system 100 is not limited to the use of these switched fabric network standards and the use of any switched fabric network standard is within the scope of the invention.

In one embodiment, backplane 104 can be an embedded packet switched backplane as is known in the art. In another embodiment, backplane 104 can be an overlay packet switched backplane that is overlaid on top of a backplane that does not have packet switched capability. In any embodiment of the invention, computing blades 108 may communicate with each other via a plurality of links, for example and without limitation, 100-ohm differential signaling pairs.

In an embodiment, embedded computer frame 102, shelf 109 and backplane 104 can use the CompactPCI (CPCI) Serial Mesh Backplane (CSMB) standard as set forth in PCI Industrial Computer Manufacturers Group (PICMG®) specification 2.20, promulgated by PICMG®, 301 Edgewater Place, Suite 220, Wakefield, Mass. CSMB provides infrastructure for applications such as Ethernet, Serial RapidIO, other proprietary or consortium based transport protocols, and the like. In another embodiment embedded computer frame 102 can use an Advanced Telecom and Computing Architecture (ATCA™) standard as set forth by PICMG™. The embodiment of the invention is not limited to the use of these standards, and the use of other standards is within the scope of the invention.

In an embodiment, embedded computer frame 102 and/or shelf 109 may provide redundancy in the slot configuration by providing that each slot has a corresponding slot such that computing blade 108 has a corresponding computing blade in a corresponding slot. For example, if computing blade 108 were to cease to function, a corresponding computing blade may assume the functions of computing blade 108 without interruption of service. This redundancy may hold for both switch blades and payload blades and provides embedded computer frame 102 with greater reliability.

In an embodiment, embedded computer frame 102 may be fed power by two or more redundant power supplies, for example power feed A and power feed B. The redundant power supplies may be passed through power distribution unit 106 to distribute power to shelves 109 and computing blades 108.

Figure 2:
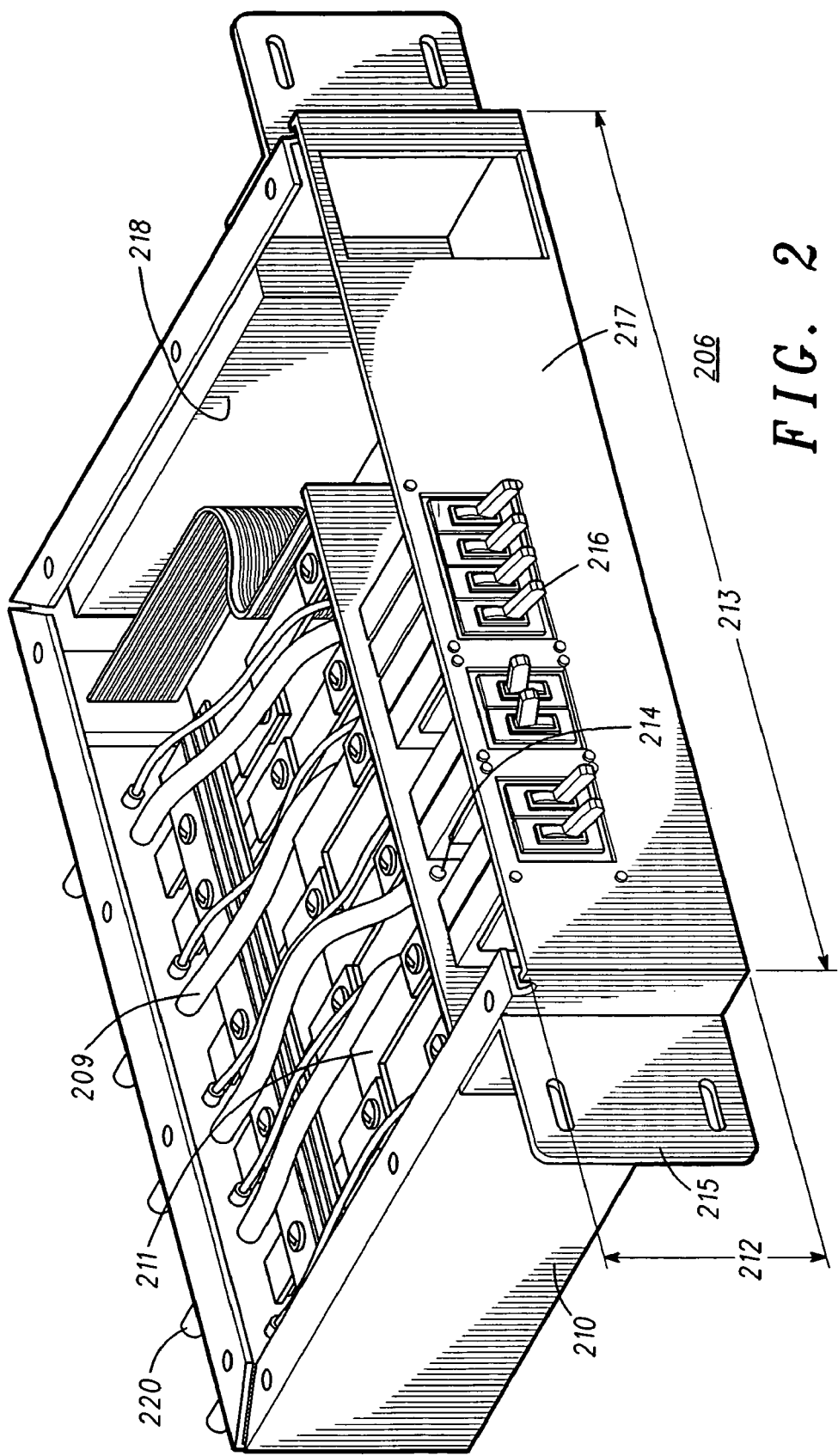
FIG. 2 representatively illustrates a power distribution unit in accordance with an exemplary embodiment of the present invention.

FIG. 2 representatively illustrates a power distribution unit 206 in accordance with an exemplary embodiment of the present invention. In an embodiment, power distribution unit 206 may provide power to embedded computer frame 102 and computing blades 108 as shown and described in FIG. 1. Power distribution unit 206 may be modular within embedded computer frame 102 and coupled to receive power from an outside source and distribute it to any number of computing blades 108 in embedded computer frame 102.

As shown in FIG. 2, power distribution unit (PDU) 206 may include power distribution unit frame 210 coupled to include a front portion 217 and a rear portion 220. Front portion 217 may be coupled to include any number of circuit breakers 216, each coupled to a circuit breaker connection site 214.

Power distribution unit frame 210 may also include power ingress and egress sites located on rear portion 220. In an embodiment, circuit breaker connection site 214 is interposed between a power ingress site and a power egress site.

Power coming into power distribution unit 206 may be distributed to circuit breaker connection sites 214 by any number of bus bars 211. After passing through a circuit breaker 216, power may exit the power distribution unit 206 to be distributed to any number of computing blades through power cabling 209.

In an embodiment, power distribution unit 206 may include alarm module 218, which may function to monitor power distribution unit 206 and the status of power being distributed by power distribution unit 206. In an embodiment, alarm module 218 may also monitor the status of computing blades being supplied by power distribution unit 206. In another embodiment, alarm module 218 may function to alert, locally and/or remotely, a system administrator of any of a set of alert conditions monitored. Alarm module 218 may be any combination of hardware, software, and the like, including software running on hardware. Although alarm module 218 is shown as being contained in power distribution unit frame 210, alarm module may be distributed among any number of entities, including power distribution unit 206 and be within the scope of the invention.

In an embodiment, power distribution unit frame 210 may have a frontal elevation dimension that may be characterized as a form factor 212. In an embodiment, the form factor 212 may include, substantially, the frontal elevation dimension. Embedded computer frame 102 may be designed to accommodate a power distribution unit frame 210 having a given form factor 212. In an exemplary embodiment, power distribution unit frame 210 may have a 2 U form factor. As is known in the art, "U" and multiples of "U" can refer to the height of a module or blade. In an embodiment, "U" can measure approximately 1.75 inches. Although power distribution unit frame 210 is shown in a horizontal configuration, this is not limiting of the invention. Power distribution unit frame 210 may be in a vertical configuration, with form factor 212 being the width of power distribution unit frame 210, and be within the scope of the invention.

In an embodiment, power distribution unit frame 210 may have a frontal length 213. The frontal length may be chosen by a systems designer, and may correspond to one of several industry standard frontal lengths. For example, a frontal length 213 of substantially 19", 23" and 600 mm are well known. Other frontal lengths are within the scope of the invention. In an embodiment, the frontal length 213 may be smaller than that accepted by an embedded computer frame 102. In this embodiment, power distribution unit frame 210 may include an adaptor module 215 on one or both ends. Adaptor module 215 may function to allow a power distribution unit frame 210 with a smaller frontal length to interface with an embedded computer frame 102 designed to accept a power distribution unit frame with a larger frontal length. Although power distribution unit frame 210 is shown in a horizontal configuration, this is not limiting of the invention. Power distribution unit frame 210 may be in a vertical configuration, with frontal length 213 being the height of power distribution unit frame 210, and be within the scope of the invention.

FIG. 3 representatively illustrates a power distribution unit 306 in accordance with an exemplary embodiment of the present invention. In the embodiment shown in FIG. 3, power distribution unit 306 has a 2 U form factor 312.

Rear portion 320 of power distribution unit frame 310 may include a plurality of power ingress sites 330 where power may enter power distribution unit 306. Each of plurality of power ingress sites 330 may include an ingress pin 332 coupled to interface with an ingress, in-line hyperboloid radial socket 334. In an exemplary embodiment, each power ingress site 330 may include two ingress pins 332, a power input pin and a return pin. Each ingress pin 332 is coupled to interface with an ingress, in-line hyperboloid radial socket 334.

In an embodiment, ingress, in-line hyperboloid radial socket 334 may be comprised of multiple contacting elements that are hyperbolically arrayed around the inner diameter of the socket. Each of the contact elements may be skewed with respect to the axial direction of the socket. When the ingress pin 332 is coupled with the socket, the contacting elements mechanically wrap around the ingress pin providing a normal force for a positive mechanical and electrical connection. Coupling ingress, in-line hyperboloid radial socket 334 to ingress pin 332 does not require mechanical fasteners. An example of an embodiment of an ingress, in-line hyperboloid radial socket 334 is the RADSOK® connector as described in the "RADSOK® High Amperage Electrical Terminals, Technical Brief" May 2001.

Ingress, in-line hyperboloid radial socket 334 may be coupled to ingress power conductor 336, wherein ingress power conductor 336 is coupled to bring power to power distribution unit 306. Radial socket 334 has an in-line configuration such that the axial direction of both the radial socket 334 and the ingress power conductor 336 are in substantially the same direction. This is as opposed to a non-in-line radial socket where the axial direction of the radial socket 334 and an ingress power conductor 336 are offset substantially ninety degrees with respect to each other.

The in-line configuration of radial socket 334 allows more power ingress sites 330 in the limited space defined by a projection of the rear portion 320 of power distribution unit 306. This also allows for a greater current capacity density of the power distribution unit 306 and plurality of power ingress sites 330, which may be defined as the amount of current input through the rear portion 320 of a power distribution unit 306.

In an embodiment, each of power ingress sites 330 may have a current capacity of at least one hundred amperes. That is to say, each power ingress site 330 is capable of conducting at least one hundred amperes into power distribution unit 306. In an embodiment, power distribution unit 306 may have at least six power ingress sites 330, giving the power distribution unit 306 and plurality of power ingress sites 330 a current capacity density of at least six hundred amperes.

Rear portion 320 of power distribution unit frame 310 may include a plurality of power egress sites 340 where power may exit power distribution unit 306.

Each of plurality of power egress sites 340 may include an egress pin 342 coupled to interface with an egress, in-line hyperboloid radial socket 344. In an exemplary embodiment, each power egress site 340 may include two egress pins 342, a power output pin and a return pin. Each egress pin 342 is coupled to interface with an egress, in-line hyperboloid radial socket 344.

In an embodiment, egress, in-line hyperboloid radial socket 344 may be comprised of multiple contacting elements that are hyperbolically arrayed around the inner diameter of the socket. Each of the contact elements may be skewed with respect to the axial direction of the socket. When the egress pin 342 is coupled with the socket, the contacting elements mechanically wrap around the egress pin providing a normal force for a positive mechanical and electrical connection. Coupling egress, in-line hyperboloid radial socket 344 to egress pin 342 does not require mechanical fasteners. An example of an embodiment of an egress, in-line hyperboloid radial socket 344 is the RADSOK® connector as described in the "RADSOK® High Amperage Electrical Terminals, Technical Brief" May 2001.

Egress, in-line hyperboloid radial socket 344 may be coupled to egress power conductor 346, wherein egress power conductor 346 is coupled to distribute power from power distribution unit 306 to any number of computing blades. Radial socket 344 has an in-line configuration such that the axial direction of both the radial socket 344 and the egress power conductor 346 are in substantially the same direction. This is as opposed to a non-in-line radial socket where the axial direction of the radial socket 344 and an egress power conductor 346 are offset substantially ninety degrees with respect to each other.

The in-line configuration of radial socket 344 allows more power egress sites 340 in the limited space defined by a projection of the rear portion 320 of power distribution unit 306. This also allows for a greater current capacity density of the power distribution unit 306 and plurality of power egress sites 340, which may be defined as the amount of current output through the rear portion 320 of a power distribution unit 306.

In an embodiment, at least a portion of the plurality of power egress sites 340 may have a current capacity of at least one hundred amperes. That is to say, at least a portion of the plurality of power egress site 340 is capable of conducting at least one hundred amperes out of power distribution unit 306. In an embodiment, power distribution unit 306 may have at least ten power egress sites 340. In an embodiment, a power egress site 340 may supply power to a computing blade requiring at least two hundred Watts.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

We claim:

1. A power distribution unit, comprising:
a power distribution unit frame, wherein the power distribution unit frame has a 2U form factor, and wherein the power distribution unit frame is coupled to mount in an embedded computer frame;
a plurality of power ingress sites coupled to a rear portion of the power distribution unit frame, wherein each of the plurality of power ingress sites has a current capacity of at least one hundred amperes, wherein each of the plurality of power ingress sites includes an ingress pin coupled to interface with an ingress in-line, hyperboloid radial socket, and wherein the power distribution unit has a current capacity density of the plurality of power ingress sites of at least six hundred amperes per power distribution unit; and at least one circuit breaker connection site coupled to the power distribution unit frame and interposed between a power ingress site and a power egress connection site.

2. The power distribution unit of claim 1, wherein the rear portion comprises a plurality of power egress sites, wherein at least a portion of the plurality of power egress sites has a current capacity of at least 100 amperes, and wherein each of the portion of the plurality of power egress sites includes an egress pin coupled to interface with an egress in-line, hyperboloid radial socket.

3. The power distribution unit of claim 1, wherein the power distribution unit is coupled to provide power to an AdvancedTCA™ embedded computer frame.

4. The power distribution unit of claim 2, wherein at least a portion of the plurality of egress sites is coupled to provide power to a computing blade in embedded computer frame.

5. The power distribution unit of claim 2, wherein at least one of the plurality of power egress sites is coupled to provide power to a computing blade in the embedded computer frame, wherein the computing blade requires at least two hundred Watts.

6. A power distribution unit, comprising:

a power distribution unit frame, wherein the power distribution unit frame has a 2U form factor, and wherein the power distribution unit frame is coupled to mount in the embedded computer frame;

a plurality of power ingress sites coupled to a rear portion of the power distribution unit frame, wherein each of the plurality of power ingress sites has a current capacity of at least one hundred amperes, wherein each of the plurality of power ingress sites includes an ingress pin and an ingress in-line, hyperboloid radial socket coupled to interface with the ingress pin, and wherein the power distribution unit has a current capacity density of the plurality of power ingress sites of at least six hundred amperes per power distribution unit; and at least one circuit breaker connection site coupled to the power distribution unit frame and interposed between a power ingress site and a power egress connection site.

7. The power distribution unit of claim 6, wherein the ingress in-line, hyperboloid radial socket is coupled to an input power conductor coupled to provide power to the power distribution unit.

8. The power distribution unit of claim 6, wherein the rear portion comprises a plurality of power egress sites, wherein at least a portion of the plurality of power egress sites has a current capacity of at least 100 amperes, and wherein each of the portion of the plurality of power egress sites includes an egress pin and an egress in-line, hyperboloid radial socket coupled to interface with the ingress pin.

9. The power distribution unit of claim 8, wherein the egress in-line, hyperboloid radial socket is coupled to an egress power conductor coupled to provide power to a computing blade in the embedded computer frame, wherein the computing blade requires at least 200 Watts.

10. The power distribution unit of claim 8, wherein the egress in-line, hyperboloid radial socket is coupled to an egress power conductor coupled to provide power to an AdvancedTCA™ embedded computer frame.

11. The power distribution unit of claim 8, wherein the egress in-line, hyperboloid radial socket is coupled to an egress power conductor coupled to provide power to an AdvancedTCA™ computing blade in the embedded computer frame.

* * * * *